(12) United States Patent
Kurihara et al.

(10) Patent No.: US 6,518,672 B2
(45) Date of Patent: Feb. 11, 2003

(54) MULTI-LAYER WIRING BOARD SUBSTRATE AND SEMICONDUCTOR DEVICE USING THE MULTI-LAYER WIRING SUBSTRATE

(75) Inventors: Takashi Kurihara, Nagano (JP); Michio Horiuchi, Nagano (JP); Shigeru Mizuno, Nagano (JP); Yuka Tamadate, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/880,978

(22) Filed: Jun. 14, 2001

(65) Prior Publication Data

US 2001/0054757 A1 Dec. 27, 2001

(30) Foreign Application Priority Data

Jun. 23, 2000 (JP) ........................................ 2000-194938

(51) Int. Cl.[7] ............................................... H01L 23/48
(52) U.S. Cl. ........................ 257/758; 257/759; 257/760
(58) Field of Search .............................. 257/772, 774, 257/779, 777, 686, 210, 758, 759, 760; 174/52.2, 52.4, 256, 260, 262; 361/790, 761; 438/622, 623, 624, 687

(56) References Cited

U.S. PATENT DOCUMENTS 6,180,881 B1 * 1/2001 Isaak .......................... 174/52.4

* cited by examiner

Primary Examiner—David Nelms
Assistant Examiner—Long Tran
(74) Attorney, Agent, or Firm—Paul & Paul (57) ABSTRACT

A multi-layer wiring substrate comprises: a plurality of wiring substrates, each of the substrates comprising a plate or sheet-like insulating layer and a wiring layer formed on only one of surfaces of the insulating layer; the plurality of wiring substrates being laminated in such a manner that the insulating layer and wiring layer are alternately arranged; at least a pair of said wiring layers arranged on respective surfaces of the insulating layer being electrically connected with each other by means of connecting portions formed so as to pass through the insulating layer; and the connecting portion comprises a part of the wiring layer which is extended into a region of an opening formed so as to pass through said insulating layer and a low-melting point metal disposed in the opening and electrically connecting the part of the wiring layer with a wiring substrate formed on an adjacent insulating layer of the laminated structure.

8 Claims, 7 Drawing Sheets

MULTI-LAYER WIRING BOARD SUBSTRATE AND SEMICONDUCTOR DEVICE USING THE MULTI-LAYER WIRING SUBSTRATE

BACKGROUND OF THE INVENTION

1. Field of the Invention

The present invention relates to a multi-layered wiring substrate and a semiconductor device using a multi-layered wiring substrate.

2. Description of the Related Art

The structure of a conventional multi-layered wiring substrate used with a semiconductor package and a method for manufacturing the same will be discussed below with reference to FIGS. 11(a) to 11(d).

Figure 11A:
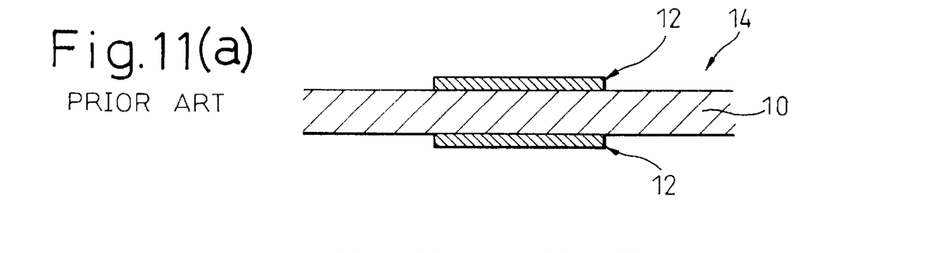
FIGS. 11(a) to 11(d) illustrate a process of fabricating a multi-layer wiring substrate known in the prior arts.

First, conductive layers such as copper foils are formed on opposite surfaces of an insulating substrate (insulating layer) 10 in the form of a sheet or plate and made of a resin material such as polyimide. The conductive layers of the insulating substrate 10 are etched so that a wiring substrate 14 comprised of the insulating substrate 10 and predetermined circuit patterns (wiring layers) 12 formed on opposite surfaces thereof can be obtained, as shown in FIG. 11(a).

Figure 11B:
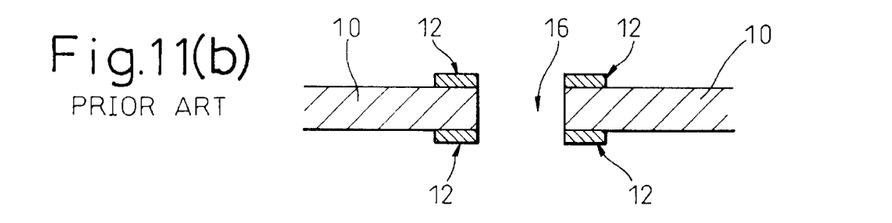

Thereafter, through holes 16, which extend through the insulating substrate 10 and the wiring layers 12, are formed at portions at which the wiring layers 12 of the wiring substrates 14 to be superimposed are to be electrically connected, as shown in FIG. 11(b).

Figure 11C:
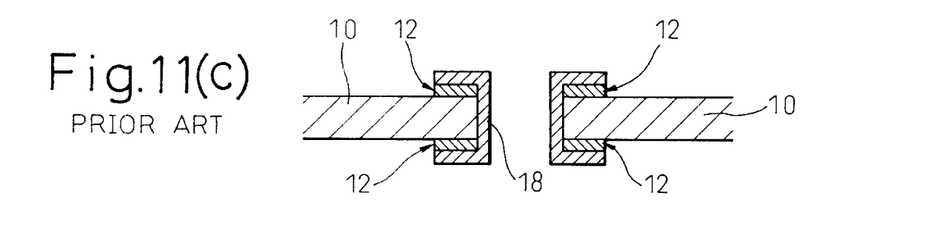

Thereafter, the inner peripheral surfaces of the through holes 16 and the surface portions of the wiring layers 12 corresponding to the through holes 16 are coated with, for example, copper plating 18, so that connecting portions (so-called "vias") 18 for establishing electrical connection between the wiring layers 12 on the opposite surfaces of the insulating substrate 10 are formed, as shown in FIG. 11(c). Note that upon plating the inner peripheral surface of the through holes 16, electroless plating is first conducted, and thereafter, electroplating is conducted.

Figure 11D:
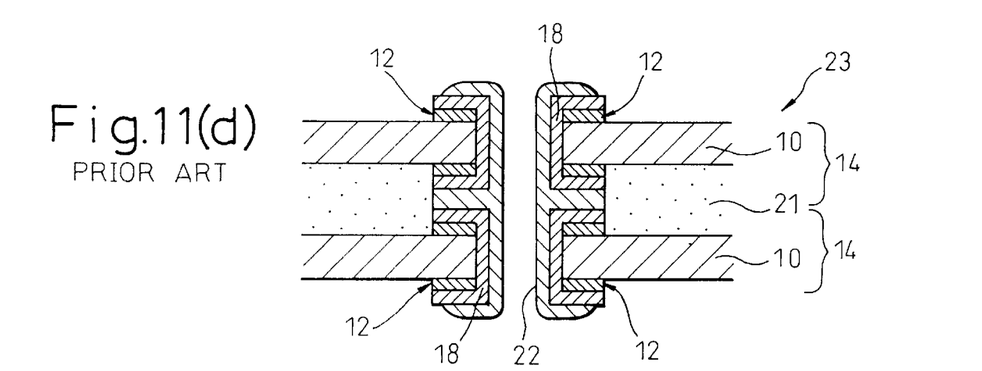

A plurality of wiring substrates 14 are superimposed through an adhesive 21.

To electrically connect the wiring layers 12 of the wiring substrates 14, the connecting portions 18 of the insulating substrates 10 are aligned along lines in the direction of the superimposition, and a heated reflowable alloy (first conductor) 22, such as a solder is introduced in the aligned connecting portions 18 to connect the same, as shown in FIG. 11(d). Consequently, a multi-layered wiring substrate 23 in which the wiring layers 12 of the wiring substrates 14 are electrically connected is obtained.

Figure 12:
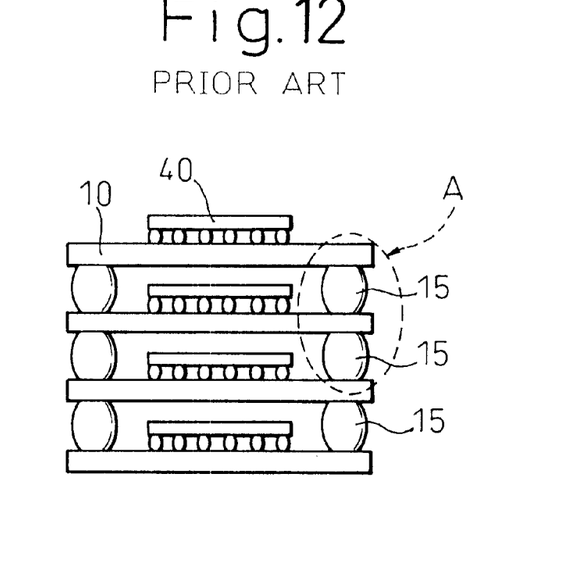
FIG. 12 illustrates a multi-layer wiring substrate using solder balls known in the prior art.
Figure 13:
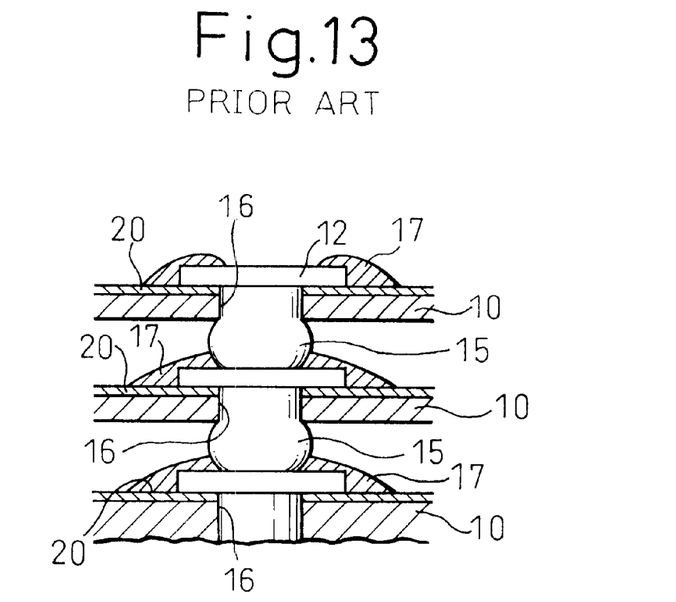
FIG. 13 is an enlarged view of the portion shown by A in FIG. 12.

FIGS. 12 and 13 show a known multi-layered semiconductor device in which electrical connection between the layers is established by solder balls. FIG. 12 shows a side sectional view of the whole structure of the semiconductor device and FIG. 13 shows an enlarged view of the part "A" in FIG. 12. In the prior art shown in FIGS. 12 and 13, a circuit pattern (wiring layer) 12 of copper is formed on one surface of an insulating substrate 10 made of a resin material, such as polyimide and a semiconductor chip 40 is formed thereon. The semiconductor packages are multi-layered to form a multi-layered semiconductor device. The insulating substrates 10 are provided with through holes 16 extending therethrough and wiring layers 12 which are formed and exposed on one surface of each insulating substrate. The electrical connection between the layers is established by reflowable solder balls 15. introduced in the through holes 16, so that the solder balls are brought into contact with the wiring layers 12 on the adjacent insulating substrates 10. Note that, in FIG. 13, numeral 20 designates the adhesive to secure the insulating substrates (polyimide) 10 and the wiring layers (e.g., copper) 12, and numeral 17 designates the solder resist.

However, in the known process of fabricating a multi-layered wiring substrate shown in FIGS. 11(a) to 11(d), it is necessary to use a wiring substrate provided, on the opposite surfaces of the insulating layers thereof, with the conductive layers, thus resulting in an increase in the cost of the elements. Moreover, in the process of formation of the connecting portions, electroless plating is necessary, thus leading to an increase in the manufacturing cost. Furthermore, since the wiring substrates which are each provided with the conductor layers formed on the opposite surfaces of the insulating layer are superimposed, the thickness of the multi-layered wiring substrate is increased.

In the known multi-layered semiconductor device shown in FIGS. 12 and 13, since the insulating substrates which are each provided on only one surface with the wiring layer, the cost can be reduced, but it is necessary to provide a space between the insulating substrates or semiconductor devices for the solder 15 to electrically connect the layers. Consequently, it is difficult to obtain a multi-layered wiring substrate or semiconductor device whose thickness is satisfactorily small.

SUMMARY OF THE INVENTION

It is an object of the present invention to provide thin and inexpensive multi-layered wiring substrate and semiconductor device, in which it is not necessary to use the wiring substrate having conductor layers formed on opposite surfaces of the insulating layer or to carry out an electroless plating operation.

To achieve the object, the present invention is constructed as follows. Namely, a multi-layered wiring substrate according to the present invention in which wiring layers and insulating layers are alternately superimposed, and at least a pair of insulating layers formed on front and rear surfaces of the insulating layers are electrically connected by connecting portions extending through the insulating layers is characterized in that the wiring layers and the insulating layers are formed by superimposing wiring substrates, each being made of a plate or sheet provided on only one of the surfaces of the insulating layer with a wiring-layer, in such a way that the wiring layers and the insulating layers are alternately arranged, -wherein the connecting portions are provided with extensions formed by a part of the wiring layers extending into the area of opening portions which extend through the insulating layers of the wiring substrates, so that the extensions and the wiring layers of the adjacent wiring substrate, located adjacent the insulating layer thereof, are electrically connected through low melting metal portions.

The portions can be through holes formed in the insulating layers. Alternatively, the holes may be cut-away portions formed at the peripheries of the insulating layers.

The low melting metal portions can be solder balls or solder pastes, or materials derived therefrom.

A semiconductor device according to the present invention can be comprised of a multi-layered wiring substrate which is provided with the wiring substrates which are in turn provided on the insulating layers thereof with recesses in which the semiconductor elements are received, and the wiring layers which define, at their one end, lead portions electrically connected to electrode terminals of the semiconductor elements and, at the other ends, extensions extending in the opening portions, and semiconductor elements which are arranged in the recesses so that the surfaces thereof on which the electrode terminals are formed are oriented toward the wiring layers, so that the lead portions of the wiring layers are electrically connected to the electrode terminals.

DETAILED DESCRIPTION OF THE EMBODIMENTS

The preferred embodiments of a multi-layered wiring substrate and a semiconductor device using the multi-layered wiring substrate according to the present invention will be discussed below with reference to FIGS. 1 through 8. Note that the components corresponding to those in the prior art are designated with like reference numerals and no detailed explanation thereof will be given hereinafter.

Figure 1:
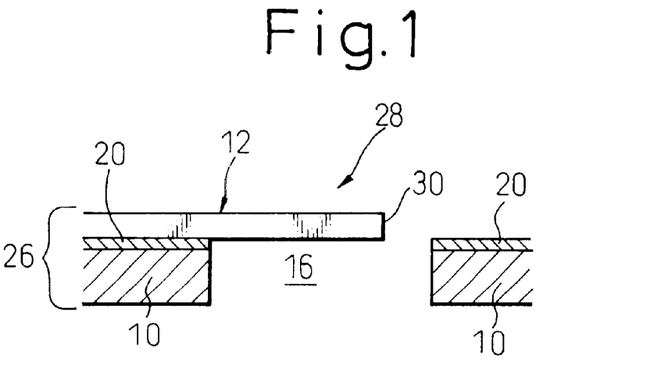
FIG. 1 is a cross-sectional view of single layer wiring substrate for the production of a multi-layer wiring substrate.
Figure 2:
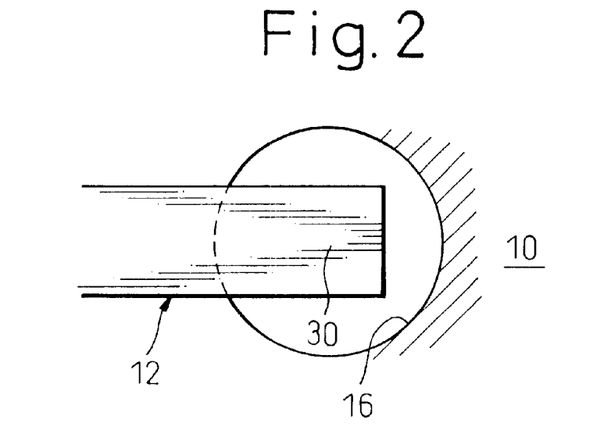
FIG. 2. is a plan view of the wiring substrate shown in FIG. 1.
Figure 5:
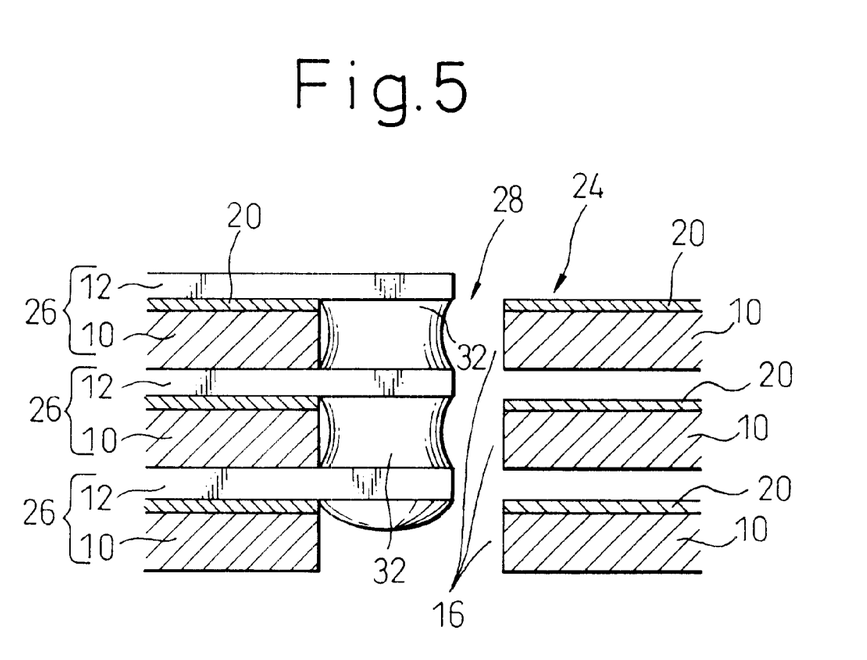
FIG. 5 is a cross-sectional view illustrating a multi-layer wiring substrate made by a reflow process on the wiring substrates laminated as shown in FIG. 4.

FIGS. 1 and 2 show a single layer of a wiring substrate 26 for producing a multi-layered wiring substrate according to this invention. FIG. 1 shows a sectional view and FIG. 2 shows a top view thereof. The wiring substrate 26 is comprised of an insulating substrate 10 as an insulating layer in the form of a sheet or plate made of a resin material, such as polyimide, and a wiring layer 12 made of, for example copper, formed on only one surface (upper surface in FIG. 1) of the insulating substrate 10. Numeral 20 designates the adhesive which adheres the insulating substrate (e.g., polyimide) 10 and the wiring layer (e.g., copper) 12. When a plurality of wiring substrates 26 are superimposed, the insulating substrates 10 and the wiring layers 12 are alternately arranged, as shown in FIG. 5.

The wiring substrate 26 is provided with a connecting portion 28 for electrically interconnecting the wiring layers 12 of the adjacent wiring substrates 26. The connecting portion 28 is provided with an extension portion 30 of the wiring layer 12 formed on the upper surface of the insulating substrate 10 and protruding into an opening 16 (through hole in the embodiment illustrated in FIG. 1) formed to connect the front and rear surfaces of the insulating substrate 10. Namely, as can be seen in FIG. 2, the extension 30 which is a part of the wiring layer 12 and extends into the area of the through hole 16 lies over the major part of the area of the through hole 16. The extension 30 of the wiring layer 12 in the area of the through hole 16 is not bent inwardly and is flush with the portion of the wiring layer 12 that is located on the upper surface of the insulating substrate 10.

The wiring substrate 26 constructed as above can be manufactured by a known process. For instance, an insulating substrate 10, as an insulating layer, provided on its one surface with an integral conductor layer such as a copper foil is prepared. The conductor layer is etched by photolithography to obtain a wiring substrate 26 having a predetermined pattern of the wiring layer 12. It is possible to form a through hole 16 in the insulating substrate 10 by drilling, prior to the formation of the wiring layer 12 on one of the surfaces of the insulating substrate 10. Alternatively, it is possible to form the through hole 16 by a laser, etc., after the wiring layer 12 is formed on one of the surfaces of the insulating substrate 10.

Although the through hole 16 has a circular cross section in the embodiment illustrated in FIGS. 1 and 2, the shape is not limited, as a matter of fact, to a circle and can be a rectangular shape, a polygonal shape or any shape.

A solder ball as a low melting metal is fed into the through hole 16 of the insulating substrate 10 and is mounted to the extension 30 of the wiring layer 12. A solder portion 32 is formed on the extension 30 so as not to come away therefrom, by reflowing of the solder ball, as can be seen in FIG. 3.

Figure 3:
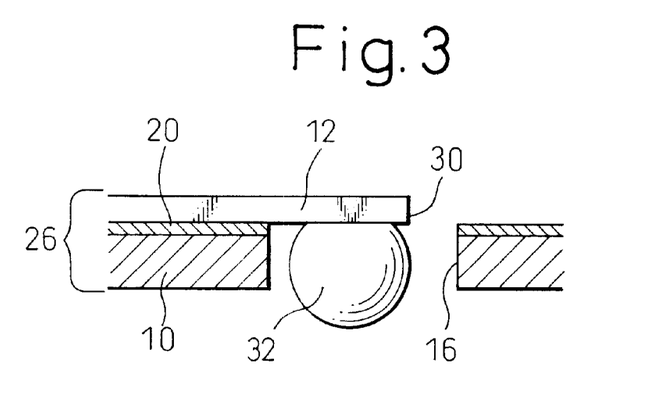
FIG. 3 is a cross-sectional view of the wiring substrate shown in FIG. 1, but including a solder portion.
Figure 4:
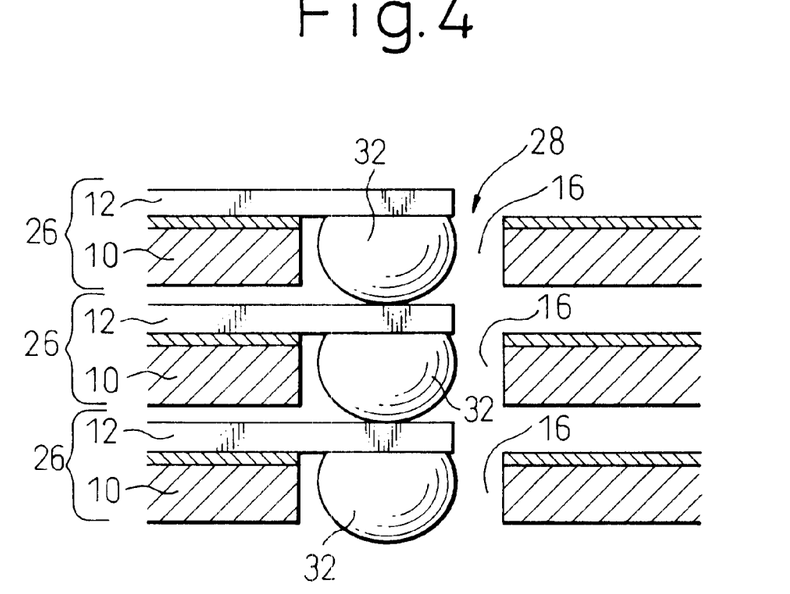
FIG. 4 is a cross-sectional view illustrating a multi-layer state of the wiring substrates shown in FIG. 3.

FIG. 4 shows a plurality of superimposed wiring substrates 26 having the solder portions 32 formed thereon, as shown in FIG. 3. To make it possible to electrically connect the wiring layers 12 of the adjacent wiring substrates 26, the wiring substrates 26 are superimposed so that the through holes 16 thereof, which constitute the connecting portions, are aligned. In this state, the reflowing of the solder portions 32 is carried out to melt the same. Consequently, the wiring layers 12 of the adjacent wiring substrates 26 are connected to establish electrical connection therebetween, as can be seen in FIG. 5.

Note that although the wiring layers 12 of the wiring substrates 26 which constitute three layers, i.e., the upper layer, the intermediate layer and the lower layer are electrically connected at the same position, in the arrangement shown in FIGS. 4 and 5, it is not always necessary to connect the three layers at the same position in the present invention. Namely, in the basic concept of the present invention, the wiring layers of at least two layers are electrically connected.

Although the solder portions 32 derived from the solder balls are used as a low melting metal in the embodiment illustrated in FIGS. 1 through 5, it is alternatively possible to use solder paste. In this alternative, the solder paste is supplied to the through hole 16 in place of the solder portion 32 derived from the solder ball in FIG. 3 and is connected to the extension of the wiring layer 12. After superimposition of the wiring substrates, the reflowing of the solder paste causes the wiring layers 12 of the adjacent wiring substrates 26 to be interconnected through the fused solder to thereby establish an electrical connection therebetween. Note that the solder ball is more preferable than the solder paste, from the viewpoint of provision of the necessary amount of solder for the connection between the layers.

In the embodiment illustrated in FIGS. 1 through 5, the connecting portions 28 of the wiring layers 12 of the wiring substrates 26 are constituted by the through holes 16 formed in the insulating substrates 10. Alternatively, in an embodiment illustrated in FIGS. 6 through 8, cut-away portions 36 of, for example, a semicircular shape, in plan view, are formed at the outer peripheral edges (peripheral edges) of the wiring substrates 26.

Figure 6:
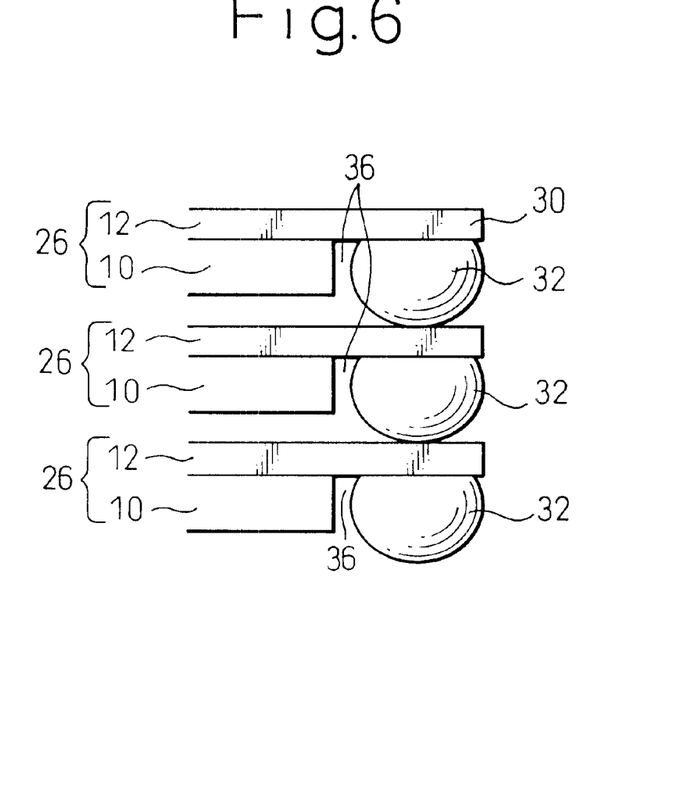
FIG. 6 is a cross-sectional view illustrating a multi-layer state of wiring substrates of another embodiment.
Figure 7:
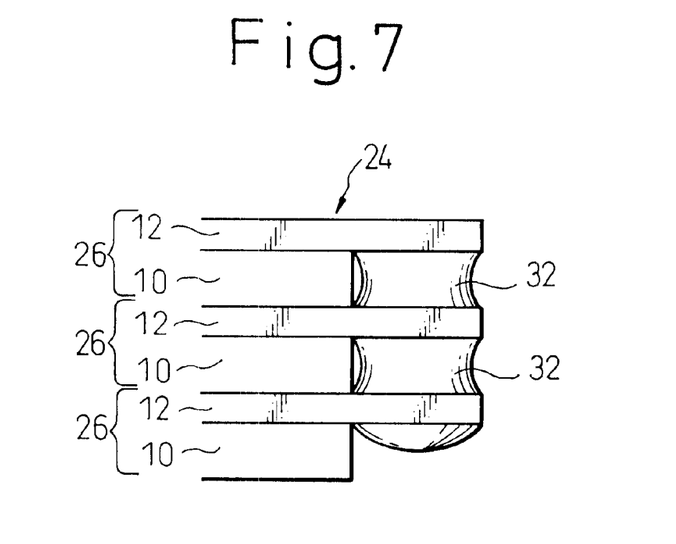
FIG. 7 is a cross-sectional view illustrating a multi-layer wiring substrate made by a reflow process on the embodiment of the wiring substrates laminated as shown in FIG. 6.
Figure 8:
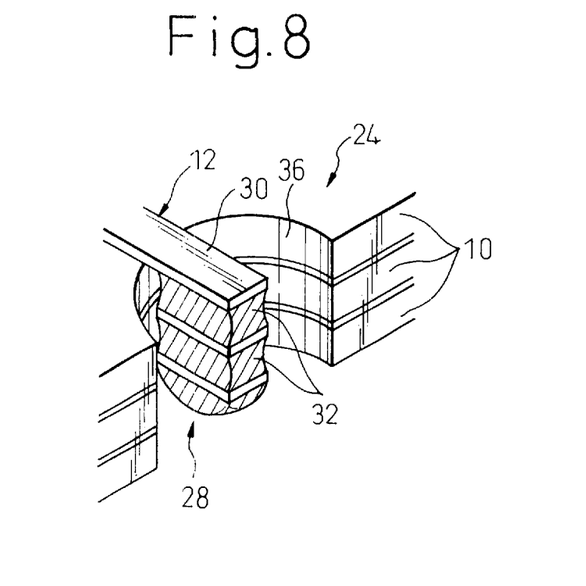
FIG. 8 is a perspective view of a connecting portion between layers of the multi-layer wiring substrate shown in FIG. 7.

Namely, as shown in FIGS. 6 through 8, the cut-away portions 36 whose shape in plan view is, for example, semicircular, are formed, in place of the through holes 16, at the outer peripheral edge portions of the wiring substrates 26. A part of the wiring layer 12 formed on one surface of each insulating substrate 10 extends into the cut-away portion 36 to define the extension 30. Like the previous embodiment, the solder ball is supplied to the cut-away portion 36 of each wiring substrate 26 to form the solder portion 32 on the extension 30 of the wiring layer 12. Thereafter, as shown in FIG. 6, the wiring substrates 26 provided with the cut-away portions 36 and the extensions 30 are superimposed so that the inner peripheral surfaces of the cut-away portions 36 are connected. The reflowing of the solder portions 32 causes the extensions 30 of the wiring substrates 26 to be electrically connected so as to form the connecting portions 28, as shown in FIGS. 7 and 8. Consequently, the multi-layered wiring substrate 24, in which the wiring layers 12 are electrically connected between the layers, can be obtained.

With this arrangement, a multi-layered wiring substrate comprised of wiring substrates (e.g., substrates having copper foil tapes on one surface thereof) which are provided, on only one surface of the insulating layers, with conductive layers and which are less expensive than a conventional wiring substrate provided on its opposite surfaces with conductive layers, can be produced. Moreover, since the connecting portions 28 which connect the adjacent wiring layers 12 opposed to each other through the insulating substrate (insulating layer) 10 can be formed without using electroless plating, the manufacturing cost can be remarkably reduced, and thus the component cost can be reduced.

<Semiconductor Device>

Figure 9:
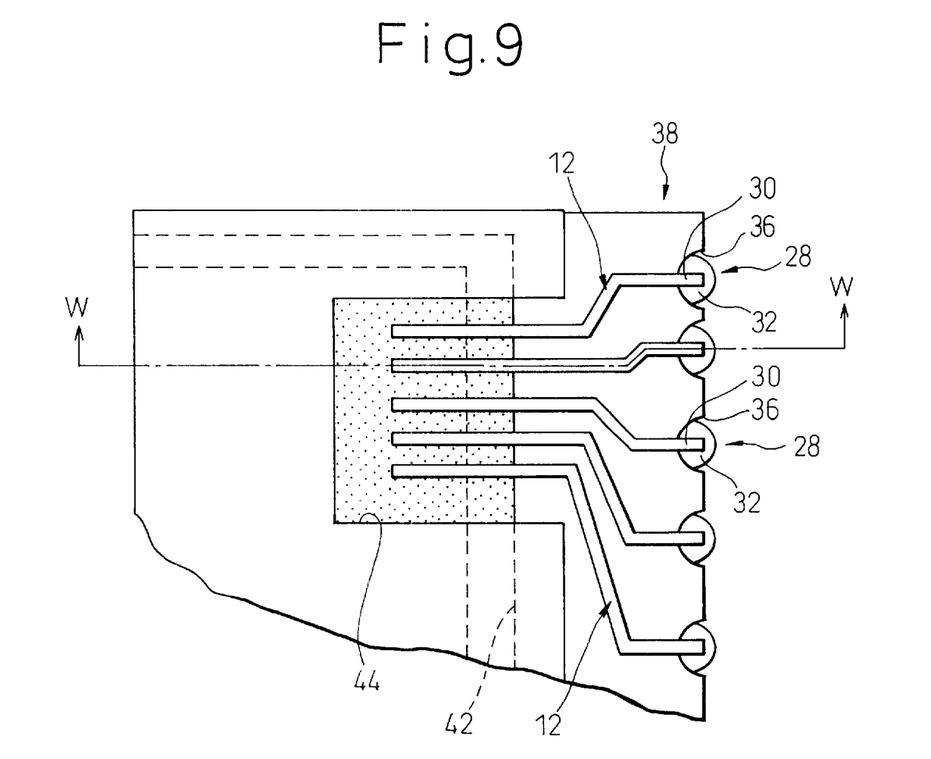
FIG. 9 is a partial plan view, seen from the wiring layer side, for illustrating an embodiment of a semiconductor device of this invention.
Figure 10:
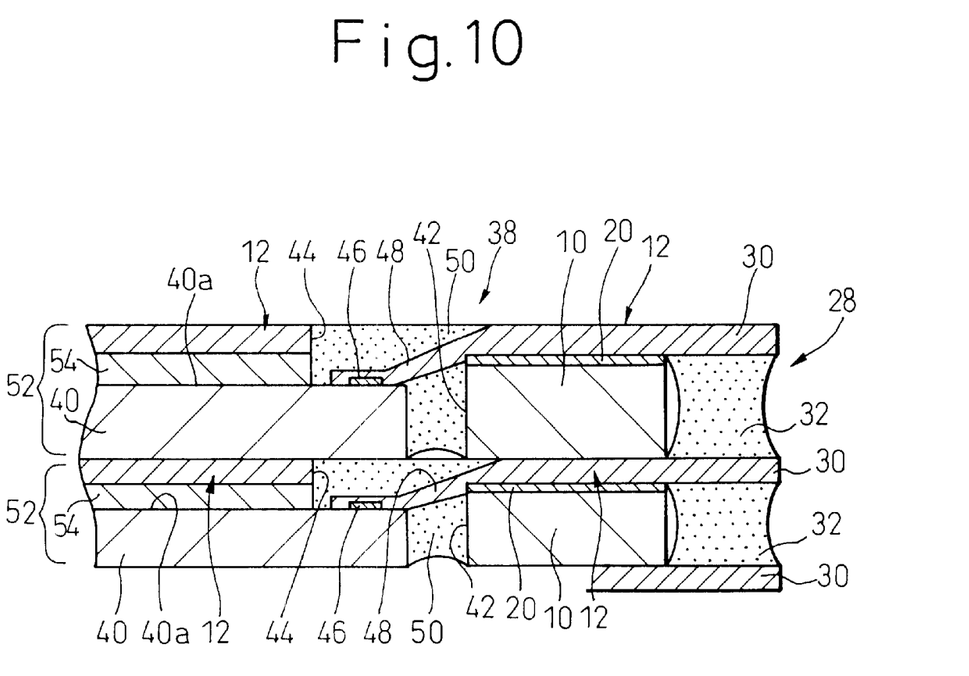
FIG. 10 is a cross-sectional view taken along line W—W in FIG. 9.

The structure of a semiconductor device using the multi-layered wiring substrate 24 will be discussed below with reference to FIGS. 9 and 10. By way of example, the connecting portions 28 are made of the cut-away portions 36 formed at the outer peripheral edge of the wiring substrate 26, and the solder portions 32 are formed on the extensions 30 of the wiring layers 12 which extend into the cut-away portions 36 and are subjected to reflowing upon superimposition. The connecting portions 28 may be made of the through holes formed in the wiring substrates 26, in place of the cut-away portions formed at the peripheral edges of the wiring substrates 26.

The semiconductor device 38 is made of the multi-layered wiring substrate 24 composed of the wiring substrates 26 which are each provided with the insulating substrate 10 and the wiring layer 12 formed on only one of the surfaces of the insulating:substrate 10 and which are superimposed so that the wiring layers 12 and the insulating substrates 10 are alternately arranged.

The insulating substrate 10 of each wiring substrate 24 is provided with a receiving recess (device hole) 42 in which the semiconductor element 40 is received. The plane wiring layer 12 is exposed to the bottom surface (upper surface in FIG. 10) of each receiving recess 42 and the lead portion in the area of the receiving recess 42 defines a window 44 extending through each wiring substrate 26 since the portion of the conductive layer other than the lead portion is etched and removed.

Each wiring layer 12 defines a lead portion 48 whose one end (left end in FIG. 9 or 10) extends in the receiving recess 42 and is connected to the electrode terminal 46 of the semiconductor element 40. The other end (right end in FIG. 9 or 10) of the lead portion 48 extends in the area of the cut-away portion 36 formed at the outer peripheral edge of the insulating substrate 10 to define the extension 30.

The semiconductor element 40 is received in each receiving recess 42 of each wiring substrate 26, so that the surface 40a (electrode terminal forming surface) of the semiconductor element on which the electrode terminal 46 is formed is opposed to the wiring layer 12. The lead portion 48 of the wiring layer 12 is connected to the electrode terminal 46 exposed to the electrode terminal forming surface 40a.

After the semiconductor elements 40 are mounted in the receiving recesses 42, the latter are filled with a resin material 50 to seal the side surfaces of the semiconductor elements 40, the electrode terminal forming surfaces 40a and the lead portions 48 of the wiring layers 12.

Thereafter, the wiring substrates 26 are superimposed so that the corresponding cut-away portions 36 communicate with each other and the extensions 30 extending in the areas of the communicating cut-away portions 36 of the wiring substrates 26 are electrically connected through the solder portions 32 to obtain the semiconductor device 38.

Note that numeral 54 designates the adhesion layer by which the semiconductor element 40 is adhered to the wiring layer 12 and numeral 20 designates the adhesion layer by which the wiring layer 12 is adhered to the insulating substrate 10.

In the semiconductor device 38, each of the superimposed wiring substrates 26 is provided with the receiving recess 42 in which the semiconductor element 40 is mounted, and hence it can be considered that a plurality of sub-semiconductor devices 52 are superimposed to form a semiconductor apparatus 38. Moreover, it can be considered that each wiring substrate 26 provided with the receiving recess 42 constitutes a sub-semiconductor device 52 which in turn constitutes a single semiconductor package.

In the multi-layered wiring substrate and the semiconductor device, according to the present invention, a multi-layered wiring substrate comprised of wiring substrates (e.g., substrates having copper foil tapes on one surface thereof) which are provided, on only one surface of the insulating layers, with conductive layers and which are less expensive than a conventional wiring substrate provided on its opposite surfaces with conductive layers, can be produced. Moreover, since the connecting portions which are formed by, for example, etching the conductive layer and which connect the wiring layers of the adjacent layers can be formed without using electroless plating, the manufacturing cost can be remarkably reduced, and thus the component cost can be reduced and the thickness of the device can be reduced. Furthermore, not only can the layers be electrically connected without a special machining operation, such as partial bending of the wiring layers, but also the extensions of the wiring layers can be connected through a low melting metal, such as a solder, thus resulting in a reduction in the manufacturing cost.

It should be understood by those skilled in the art that the foregoing description relates to only some preferred embodiments of the disclosed invention, and that various changes and modifications may be made to the invention without departing from the sprit and scope thereof.

What is claimed is:

1. A multi-layer wiring substrate comprising:

a plurality of wiring substrates, each of said substrates comprising a plate or sheet-like insulating layer and a wiring layer formed on only one of the surfaces of the insulating layer;

said plurality of wiring substrates being laminated in such a manner that said insulating layer and wiring layer are alternately arranged;

at least a pair of said wiring layers arranged on respective surfaces of the insulating layer being electrically connected with each other by means of connecting portions formed so as to pass through said insulating layer; and said connecting portion comprising a part of wiring of said wiring layer, which is extended into a region of an opening, formed so as to pass through said insulating layer, so that only said part of wiring being formed as an extension and a low melting point metal disposed in said opening and electrically connecting said extension of the wiring layer with a wiring substrate formed on an adjacent insulating layer of the laminated structure.

2. A multi-layer wiring substrate as set forth in claim 1, wherein said opening is a through hole formed in said insulating layer.

3. A multi-layer wiring substrate as set forth in claim 1, wherein said opening is a cut-away portion formed at a periphery of said insulating layer.

4. A multi-layer wiring substrate as set forth in claim 1, wherein said low-melting point metal is a solder ball or solder paste.

5. A semiconductor device comprising:

a multi-layer wiring substrate comprising:

a plurality of wiring substrates, each of said substrates comprising a plate or sheet-like insulating layer and a wiring layer formed on only one of the surfaces of the insulating layer;

said plurality of wiring substrates being laminated in such a manner that said insulating layer and wiring layer are alternately arranged;

at least a pair of said wiring layers arranged on respective surfaces of the insulating layer being electrically connected with each other by means of connecting portions formed so as to pass through said insulating layer; and said connecting portion comprising a part of wiring of said wiring layer which is extended into a region of an opening, formed so as to pass through said insulating layer, so that only said part of wiring being formed as an extension and a low melting point metal disposed in said opening and electrically connecting said extension of the wiring layer with a wiring substrate formed on an adjacent insulating layer of the laminated structure;

said insulating layer of the respective wiring substrate having a semiconductor element accommodation recess and wiring layer formed, at one end thereof with a lead which is to be electrically connected to an electrode of said semiconductor element and, at the other end thereof, with an extension which is extended into said region of the opening; and semiconductor elements each having an electrode forming surface, each of said semiconductor elements being accommodated in said recess in such a manner that said electrode forming surface faces said wiring layer and electrodes of said semiconductor element are electrically connected with said lead of the wiring layer.

6. A semiconductor device as set forth in claim 5, wherein said opening of the respective insulating layer of the multi-layer wiring substrate is a through hole formed in said insulating layer.

7. A semiconductor device as set forth in claim 5, wherein said opening of the respective insulating layer of the multi-layer wiring substrate is a cut-away portion formed at a periphery of said insulating layer.

8. A semiconductor device as set forth in claim 5, wherein said low-melting point metal is a solder ball or a solder paste.

* * * * *